United States Patent
Shiomi et al.

(10) Patent No.: US 12,426,152 B2
(45) Date of Patent: Sep. 23, 2025

(54) CONTROL CIRCUIT USING IC, 3-TERMINAL CAPACITOR, AND COMPONENTS IN A POWER SUPPLY DEVICE

(71) Applicant: SHARP KABUSHIKI KAISHA, Sakai (JP)

(72) Inventors: Takeshi Shiomi, Sakai (JP); Kentaro Kishira, Sakai (JP)

(73) Assignee: SHARP KABUSHIKI KAISHA, Sakai (JP)

( * ) Notice: Subject to any disclaimer, the term of this patent is extended or adjusted under 35 U.S.C. 154(b) by 114 days.

(21) Appl. No.: 18/221,430

(22) Filed: Jul. 13, 2023

(65) Prior Publication Data
US 2024/0314924 A1 Sep. 19, 2024

(30) Foreign Application Priority Data
Aug. 3, 2022 (JP) .................. 2022-123644

(51) Int. Cl.
| H05K 1/02 | (2006.01) |
| H01G 4/224 | (2006.01) |
| H01G 4/232 | (2006.01) |
| H05K 1/18 | (2006.01) |

(52) U.S. Cl.
CPC .......... *H05K 1/0231* (2013.01); *H01G 4/224* (2013.01); *H01G 4/232* (2013.01); *H05K 1/181* (2013.01)

(58) Field of Classification Search
None
See application file for complete search history.

(56) References Cited

U.S. PATENT DOCUMENTS

| 4,584,627 A * | 4/1986 | Schilling ............. H01G 4/35 29/25.42 |
| 5,379,189 A * | 1/1995 | Merriman ............. H05K 1/111 174/262 |
| 5,844,762 A * | 12/1998 | Yamamura ........... H05K 1/0234 361/111 |
| 6,473,291 B1 * | 10/2002 | Stevenson ............ H05K 3/3426 361/309 |
| 6,936,914 B2 * | 8/2005 | Shinomiya ............ H01L 23/552 257/E23.079 |

(Continued)

FOREIGN PATENT DOCUMENTS

| JP | 2020039625 A1 | 3/2021 |
| WO | 2016092833 A1 | 6/2016 |

*Primary Examiner* — Timothy J. Dole
*Assistant Examiner* — Muhammed Azam
(74) *Attorney, Agent, or Firm* — ScienBiziP, P.C.

(57) ABSTRACT

A control circuit formed on a PCB includes an IC, a 3-terminal capacitor, and a first component. The IC has a structure where four or more terminals are arranged on one side of the IC, the 3-terminal capacitor includes a feed-through electrode and a reference electrode, and the first component has one end and another end. The first wire is wired in a direction along the one side of the IC. The 3-terminal capacitor is configured such that one end of the feedthrough electrode is connected to any terminal of the IC, and such that the reference electrode is connected to the first wire. The one end of the first component is connected to any terminal of the IC, and the first component straddles the first wire or connects the first wire to the other end.

2 Claims, 2 Drawing Sheets

(56) References Cited

U.S. PATENT DOCUMENTS

| | | | | |
|---|---|---|---|---|
| 6,995,629 | B2* | 2/2006 | Nishimura | H05K 1/0246 333/32 |
| 7,881,040 | B2* | 2/2011 | Togashi | H05K 1/0231 361/306.3 |
| 7,929,315 | B2* | 4/2011 | Hayashi | H05K 1/0231 361/780 |
| 9,468,994 | B2* | 10/2016 | Kinoshita | B23K 1/0016 |
| 9,538,634 | B2* | 1/2017 | Yamaguchi | H05K 1/0245 |
| 9,743,522 | B2* | 8/2017 | Li | H05K 1/11 |
| 9,844,135 | B2* | 12/2017 | Wu | H05K 1/113 |
| 9,998,084 | B2* | 6/2018 | Kanezaki | H01G 4/30 |
| 10,178,770 | B1* | 1/2019 | Burk | H01G 4/228 |
| 10,250,215 | B2* | 4/2019 | Kashiwakura | H01G 4/30 |
| 10,361,631 | B2* | 7/2019 | Zhou | H05K 1/181 |
| 10,470,296 | B2* | 11/2019 | Miyasaka | H05K 1/0245 |
| 10,477,676 | B2* | 11/2019 | Kim | G02F 1/13452 |
| 10,606,792 | B2* | 3/2020 | Maier | G06F 13/102 |
| 10,764,991 | B2* | 9/2020 | Park | H05K 1/0257 |
| 10,770,206 | B1* | 9/2020 | Aga | G01L 1/18 |
| 10,892,316 | B2* | 1/2021 | Kirkman | H05K 3/3436 |
| 11,202,914 | B2* | 12/2021 | Harding | A61N 5/022 |
| 11,744,020 | B2* | 8/2023 | Norell | H01L 23/3107 174/250 |
| 2004/0119553 | A1* | 6/2004 | Nishimura | H05K 1/0246 333/22 R |
| 2006/0022320 | A1* | 2/2006 | Nakanishi | H01L 24/05 439/259 |
| 2007/0123949 | A1* | 5/2007 | Dabney | H03H 1/0007 607/37 |
| 2007/0253177 | A1* | 11/2007 | Nibe | H05K 1/0231 361/763 |
| 2012/0229998 | A1* | 9/2012 | Kagaya | H01P 3/085 361/777 |
| 2017/0323729 | A1* | 11/2017 | Kashiwakura | H05K 1/0231 |
| 2018/0317317 | A1* | 11/2018 | Nakanishi | H05K 1/0306 |
| 2021/0111626 | A1 | 4/2021 | Miki et al. | |
| 2024/0314924 | A1* | 9/2024 | Shiomi | H01G 4/224 |
| 2025/0016911 | A1* | 1/2025 | Szczeszynski | H02M 3/003 |

* cited by examiner

CONTROL CIRCUIT USING IC, 3-TERMINAL CAPACITOR, AND COMPONENTS IN A POWER SUPPLY DEVICE

BACKGROUND

1. Field

The following disclosure relates to a control circuit and a power supply device. The present application claims priority from Japanese Application No. JP2022-123644, the content of which is hereby incorporated by reference into this application.

2. Description of the Related Art

A control circuit that is connected to a power supply circuit is required to have a simplified wire layout. Re-publication of PCT International Publication No. 2020-039625 discloses one example.

SUMMARY

However, even using such a control circuit still has room for improvement.

One aspect of the present disclosure provides a control circuit and a power supply device that have a more simplified wire layout than before.

To solve the above problem, a control circuit according to one aspect of the present disclosure is a control circuit formed on a PCB.

The control circuit includes the following: an IC; a 3-terminal capacitor; and a first component, the IC has a structure where four or more terminals are arranged on one side of the IC, the 3-terminal capacitor includes a feedthrough electrode and a reference electrode, the first component has one end and another end, and the 3-terminal capacitor and the first component are surface-mount components.

The PCB includes a first wire, and the first wire is wired in a direction along the one side of the IC.

The 3-terminal capacitor is configured such that one end of the feedthrough electrode is connected to any terminal of the IC, and such that the reference electrode is connected to the first wire.

The one end of the first component is connected to any terminal of the IC.

The first component "straddles the first wire" or "connects the first wire to the another end".

To solve the above problem, a power supply device according to one aspect of the present disclosure is a power supply device including the control circuit.

DESCRIPTION OF THE EMBODIMENTS

First Preferred Embodiment

The Specification expresses, for instance, a "control circuit CNT1" also merely as "CNT1" in order to simplify the document. Abbreviations that are used are defined as follows. A PCB denotes a printed circuit board. An IC denotes an integrated circuit.

A 3-terminal capacitor denotes a 3-terminal feedthrough capacitor. Although multilayer ceramic capacitors (MLCCs) are used as the materials of 3-terminal capacitors, their materials are not limited to them.

Increase in the number of wires in a control circuit makes it difficult to change (replace) the order of wire arrangement. This problem is often seen in an IC with four or more pins. Wire replacement is typically achieved by moving a wire that is to be replaced to a different layer through addition of the number of layers of a PCB, and through addition of a through-hole. This preferred embodiment discloses a control circuit that can simplify layout by using a 3-terminal capacitor, and wires, which will be described later on.

Example Structure of 3-Terminal Capacitor

The 3-terminal capacitor includes a feedthrough electrode and a reference electrode. The reference electrode, which is also referred to as a GND terminal, can be used as well by connecting to a member, such as a power supply, other than a GND. The 3-terminal capacitor is a capacitor provided with an electrostatic capacitance between the feedthrough electrode and reference electrode.

Figure 2:
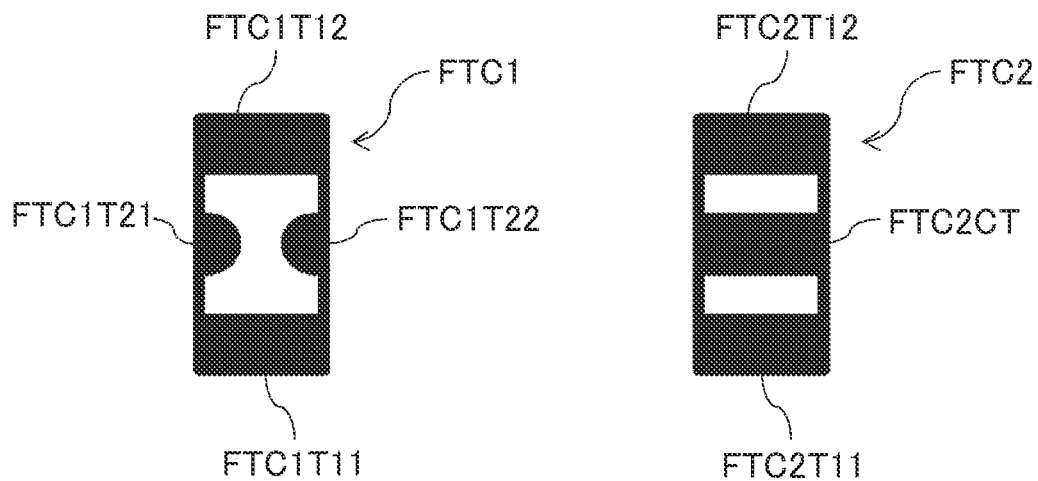
FIG. 2 is a diagram illustrating two kinds of 3-terminal capacitors according to one preferred embodiment of the present disclosure.

FIG. 2 illustrates two kinds of 3-terminal capacitors. One of the 3-terminal capacitors, FTC1, has one end FTC1T11 of the feedthrough electrode and the other end FTC1T12 of the feedthrough electrode, and both ends are electrically connected together inside the 3-terminal capacitor. The reference electrode as well has one end FTC1T21 and the other end FTC1T22. Both ends are connected together inside as well, like both ends of the feedthrough electrode.

The 3-terminal capacitor can be used as well by replacing the feedthrough electrode and reference electrode, which are of the same feedthrough structure.

Other than foregoing, FTC1T21 and FTC1T22 can be used as well by connecting them together outside.

The other 3-terminal capacitor, FTC2, has one end FTC2T11 of the feedthrough electrode and the other end FTC2T12 of the feedthrough electrode. FTC2CT is provided as the reference electrode.

FTC1 and FTC2 are both surface-mount components.

Example Configuration of Control Circuit That Can Simplify Wire Layout

Figure 1:
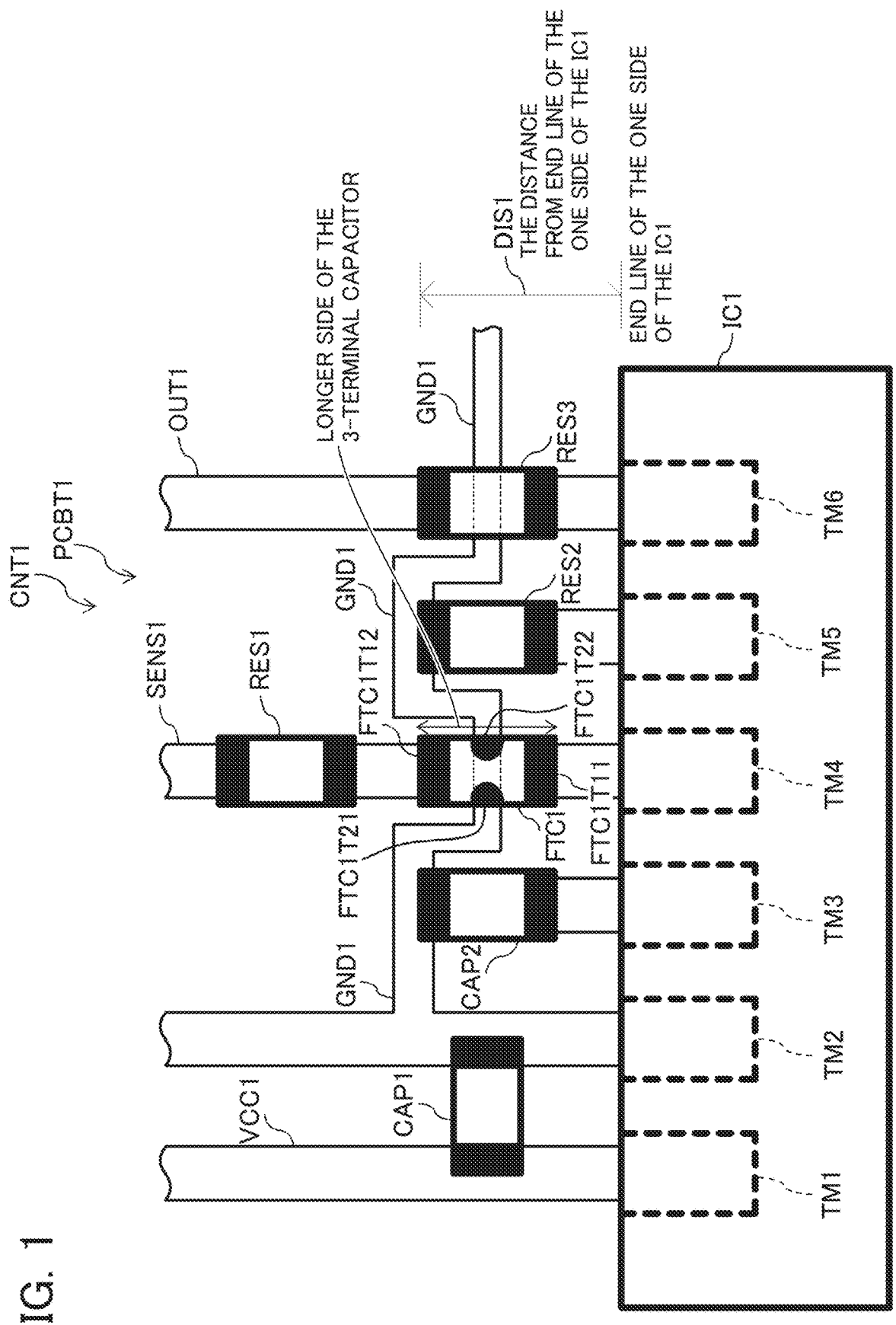
FIG. 1 is a diagram illustrating the configuration of a control circuit according to one preferred embodiment of the present disclosure.

FIG. 1 illustrates the control circuit CNT1 formed on a PCB (PCB's surface PCBT1). An integrated circuit (IC) IC1 includes six terminals TM1 to TM6. TM1 is a 3.3V power supply terminal, TM2 is a GND terminal, TM3 is an inner power supply terminal, TM4 is a sensing terminal, TM5 is a control terminal, and TM6 is a signal output terminal. TM1 to TM6 are arranged on one side of IC1. In detail, they are disposed so as to be flush with the one side of IC1. TM1 to TM6 are denoted by dotted lines in order to indicate that they are located under IC1.

A power supply wire VCC1 is connected to TM1. A GND wire GND1 is connected to TM2. VCC1 and GND1 are conductive wire patterns (traces) formed on the PCB. GND1 is wired in a direction along the one side of the IC1. The power supply wire can be replaced with GND1, and the GND wire can be replaced with VCC1, in accordance with the specifications of the IC1's terminals.

An input capacitor CAP1 is connected to TM1 and TM2 via VCC1 and GND1. An inner power supply capacitor CAP2 has one end connected to TM3, and the other end connected to GND1.

The one end of CAP2, although being connected to TM3 via a wire, may be directly connected to TM3. This "connection via a wire" or "direct connection", which is irrelevant to the circuit configuration, is described merely as "connection". The connections to TM4 to TM6, and the connection between a first resistor RES1 and FTC1T12 are likewise described as "connection".

A sense signal line SENS1 is connected to TM4 via RES1 and the FTC1's feedthrough electrode (FTC1T11 and FTC1T12) connected in series.

FTC1T21 and FTC1T22 are connected to GND1. FTC1 in FIG. 2 and FTC1 in FIG. 1 are the same element.

GND1, which passes under FTC1, is denoted by a dotted line in the drawing. GND1 in this dotted-line portion, even having no wiring, is still the same in terms of a circuit. This is because that FTC1T21 and FTC1T22 are connected together inside FTC1. CNT1 can include FTC2 in place of FTC1.

A second resistor RES2 has one end connected to TM5, and the other end connected to GND1.

A third resistor RES3 has one end connected to TM6, and the other end connected to a signal line OUT1.

RES3 straddles GND1, and thus, GND1 under RES3 is denoted by a dotted line in the drawing. RES3, which straddles, is not connected to anything except TM6 and the signal line OUT1.

CAP1, CAP2, RES1, RES2 and RES3 are surface-mount components each having one end and the other end. These resistors or capacitors can be changed as appropriate into a capacitor, a resistor, an inductance, a diode or other kinds in accordance with the specifications of CNT1 or IC1. These components, which can be changed irrespective of kinds, are on the whole referred also to as a component in the present disclosure.

Further, this component, FTC1, IC1 and the wires are all formed on the PCB's front surface. All can be formed on the back surface as well, as necessary.

Main Configuration of Control Circuit

CNT1 is formed on the PCB.

CNT1 includes IC1, FTC1, and RES2 or RES3, both of which are first components.

IC1 has a structure where four or more terminals are arranged on one side of IC1.

FTC1 includes a feedthrough electrode and a reference electrode.

The first component has one end and the other end.

FTC1 and the first component are surface-mount components.

The PCB includes GND1, which is a first wire.

The first wire is wired in a direction along the one side of the IC.

The first wire needs to avoid any component terminal on the PCB, and to connect a terminal of any component. To achieve both of this avoidance and connection, the first wire, although being wired in a curved line rather than in a straight line, is wired in the direction along the one side of IC1 as a whole. The first wire is wired on the same plane as the plane where FTC1 and the first component are mounted. That the first wire is wired in the direction along the one side of IC1 can be referred also to as that the first wire is substantially parallel with the one side of IC1 as a whole. The word "substantially parallel" means an angle of, for instance, 0 to 45 degrees; for instance, an angle of more than 45 degrees complicates the wire layout.

FTC1 is configured such that one end of the feedthrough electrode is connected to any terminal of IC1, and such that the reference electrode is connected to the first wire.

The one end of the first component is connected to any terminal of IC1, and the first component "straddles the first wire" or "connects the first wire to the other end".

CNT1 like this enables FTC1 and/or the first component to be connected to the first wire wired in the direction along the one side of IC1. This can simplify the wire layout.

Additional Configuration of Control Circuit

The first wire is a power supply or a GND connected to IC1. CNT1 is formed on either the front surface or back surface of the PCB.

Using the first wire can stabilize the IC1's circuit control when this wire is a stable potential, such as a power supply or a GND.

The circuit constituting CNT1 is formed on either the front surface or back surface of the PCB, thus facilitating simplification of the wire layout.

FTC1 and the first component are disposed in a range from the one side of IC1 to 10 times of the length of the longer side of FTC1.

The FTC1's longer side measures 1 mm for instance. FTC1 and "RES2 or RES3" are disposed within, for instance, 1.6 mm of an arrow DIS1 from the one side of IC1. FTC1 and "RES2 or RES3" are disposed in a range of 10 times of the length of the FTC1's longer side, thus facilitating simplification of the wire layout.

CNT1 further includes a second component. The second component has one end and the other end.

The one end of the second component is connected to any terminal of IC1. The second component straddles the first wire. The first component connects the first wire to the other end.

To be specific, the second component is RES3 and staddles GND1, and its one end is connected to IC1. The first component is RES2, its one end is connected to IC1, and its other end is connected to GND1.

Second Preferred Embodiment

Figure 3:
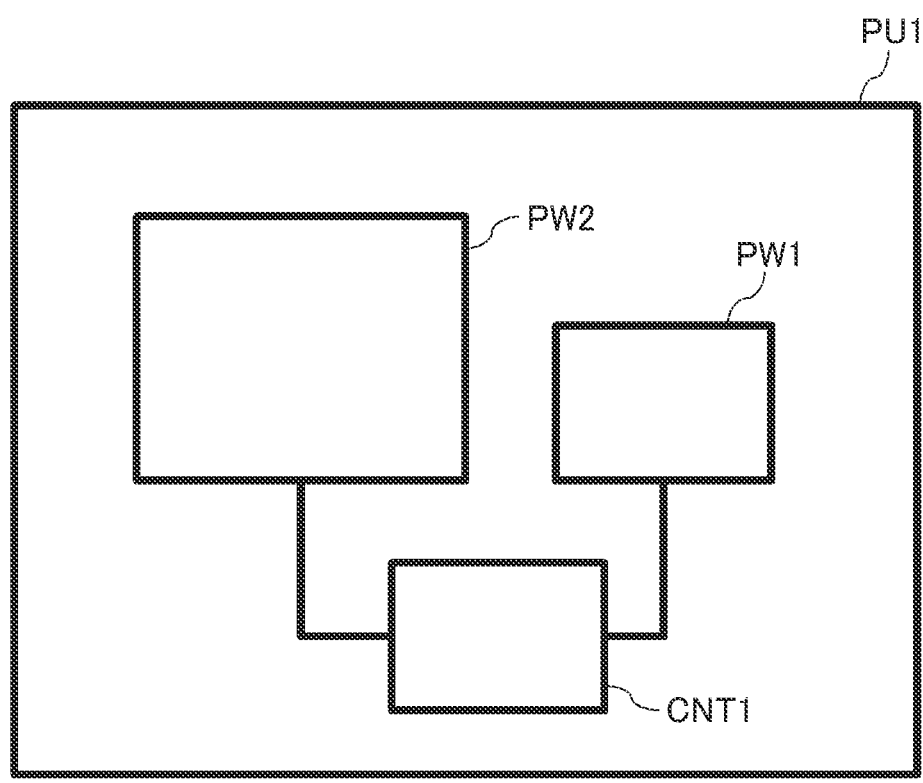
FIG. 3 is a diagram illustrating the control circuit connected to a power supply circuit according to one preferred embodiment of the present disclosure.

FIG. 3 illustrates an instance where CNT1 is connected to a power supply circuit.

An auxiliary power supply circuit PW1 is connected for supplying electric power to CNT1. CNT1 is connected for controlling a main power supply circuit PW2. A power supply device PUI includes CNT1, PW1, and PW2.

PUI can be equipped with CNT1 having a simplified layout.

It should be noted that each of the foregoing numeric values is a mere example. To adjust circuit operations, a resistor can be inserted into a wire as appropriate, or a capacitor can be added between wires as appropriate.

Additional Note

One aspect of the present disclosure is not limited to the foregoing preferred embodiments. Various modifications can be devised within the scope of the claims. A preferred embodiment that is obtained in combination, as appropriate, with the technical means disclosed in the respective preferred embodiments is also included in the technical scope of one aspect of the present disclosure. Furthermore, combining the technical means disclosed in the respective preferred embodiments can form a new technical feature.

What is claimed is:

1. A control circuit formed on a printed circuit board (PCB), the control circuit comprising:
    an integrated circuit (IC);
    a 3-terminal capacitor;
    a first component; and
    a second component,
    wherein the IC has a structure, such that four or more terminals are arranged on one side of the IC,
    the 3-terminal capacitor includes a feedthrough electrode and a reference electrode,
    the first component has one end and another end,
    the 3-terminal capacitor and the first component are surface-mount components,
    the PCB includes a first wire,
    the first wire is wired in a direction along the one side of the IC,
    the 3-terminal capacitor is configured such that:
        one end of the feedthrough electrode is connected to any terminal of the four or more terminals of the IC, and
        the reference electrode is connected to the first wire,
    the one end of the first component is connected to any terminal of the four or more terminals of the IC,
    the other end of the first component is connected to the first wire,
    the first wire is a power supply wire or a ground (GND) wire connected to the IC,
    the control circuit is formed on either a front surface of the PCB or a back surface of the PCB,
    the 3-terminal capacitor and the first component are disposed on the PCB within a range of 10 times of a length of a longer side of the 3-terminal capacitor from the one side of the IC,
    the second component has one end and another end,
    the one end of the second component is connected to any other terminal of the four or more terminals of the IC, and
    the second component straddles the first wire.

2. A power supply device comprising the control circuit according to claim 1.

* * * * *